(12) United States Patent
Yoon et al.

(10) Patent No.: US 11,395,548 B2
(45) Date of Patent: Jul. 26, 2022

(54) WALL MOUNT AND DISPLAY APPARATUS HAVING THE SAME

(71) Applicant: SAMSUNG ELECTRONICS CO., LTD., Suwon-si (KR)

(72) Inventors: Dae Sik Yoon, Suwon-si (KR); Myeong Gil Kim, Suwon-si (KR); Tae Youn Yoon, Suwon-si (KR); Dong Jin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 253 days.

(21) Appl. No.: 16/814,516

(22) Filed: Mar. 10, 2020

(65) Prior Publication Data

US 2021/0068543 A1 Mar. 11, 2021

(30) Foreign Application Priority Data

Sep. 11, 2019 (KR) .................. 10-2019-0113051

(51) Int. Cl.
*H05K 7/02* (2006.01)
*H05K 7/04* (2006.01)
(Continued)

(52) U.S. Cl.
CPC .............. *A47B 97/001* (2013.01); *F16B 1/00* (2013.01); *F16M 13/022* (2013.01); *H01F 7/02* (2013.01);
(Continued)

(58) Field of Classification Search
USPC ................................ 361/807, 728, 809, 810
See application file for complete search history.

(56) References Cited

U.S. PATENT DOCUMENTS 7,611,109 B2 * 11/2009 Lin .................. F16M 13/02
248/222.52
8,297,571 B2 * 10/2012 Xue ..................... F16M 11/041
248/220.22
(Continued)

FOREIGN PATENT DOCUMENTS

CN 201723943 U 1/2011
CN 109630843 A 4/2019
(Continued)

OTHER PUBLICATIONS

International Search Report dated Jul. 17, 2020, in corresponding International Patent Application No. PCT/KR2020/003814.
(Continued)

*Primary Examiner* — Hung S. Bui
(74) *Attorney, Agent, or Firm* — Staas & Halsey LLP

(57) ABSTRACT

A wall mount including a guide member. The guide member includes a first guide coupling portion positioned in one end portion of the guide member, a second guide coupling portion positioned in another end portion of the guide member, the second guide coupling portion being symmetrical to the first guide coupling portion, a third guide coupling portion positioned between the first guide coupling portion and a center of the guide member, and a fourth guide coupling portion positioned between the second guide coupling portion and the center of the guide member and being symmetrical to the third guide coupling portion; a first fixing bracket coupleable to the first guide coupling portion or the third guide coupling portion; and a second fixing bracket coupleable to the second guide coupling portion or the fourth guide coupling portion.

19 Claims, 15 Drawing Sheets

(51) Int. Cl.
  *A47B 97/00* (2006.01)
  *F16B 1/00* (2006.01)
  *F16M 13/02* (2006.01)
  *H01F 7/02* (2006.01)
  *H05K 5/00* (2006.01)
  *H05K 5/02* (2006.01)
  *H05K 7/14* (2006.01)

(52) U.S. Cl.
  CPC ........... *H05K 5/0017* (2013.01); *H05K 5/023* (2013.01); *H05K 7/14* (2013.01); *F16B 2001/0035* (2013.01)

(56) References Cited

U.S. PATENT DOCUMENTS

| | | | | |
|---|---|---|---|---|
| 8,979,049 B2 * | 3/2015 | Yoshida | ................. | F16M 13/02 248/224.51 |
| 2006/0231711 A1 * | 10/2006 | Shin | ...................... | F16M 11/10 248/291.1 |
| 2007/0007413 A1 * | 1/2007 | Jung | ....................... | H04N 5/64 248/284.1 |
| 2013/0168519 A1 | 7/2013 | In et al. | | |
| 2014/0270910 A1 | 9/2014 | Sculler et al. | | |
| 2016/0348832 A1 * | 12/2016 | Yoo | ........................ | F16M 13/02 |
| 2017/0202097 A1 * | 7/2017 | Lee | ........................ | F16M 13/02 |
| 2018/0063971 A1 | 3/2018 | Han et al. | | |

FOREIGN PATENT DOCUMENTS

| | | |
|---|---|---|
| KR | 20-0287264 Y1 | 8/2002 |
| KR | 20-0438463 Y1 | 2/2008 |
| KR | 10-2009-0061701 A | 6/2009 |
| KR | 10-2018-0050895 | 5/2018 |
| KR | 10-1949476 B1 | 2/2019 |

OTHER PUBLICATIONS

Extended European Search Report dated Oct. 16, 2020, in corresponding European Patent Application No. 20162426.9.

* cited by examiner

WALL MOUNT AND DISPLAY APPARATUS HAVING THE SAME

CROSS-REFERENCE TO RELATED APPLICATION

This application is based on and claims priority under 35 U.S.C. § 119 to Korean Patent Application No. 10-2019-0113051, filed on Sep. 11, 2019 in the Korean Intellectual Property Office, the disclosure of which is incorporated by reference herein in its entirety.

BACKGROUND

1. Field

The disclosure relates to a wall mount and a display apparatus having the same, and more particularly, to a wall mount capable of mounting a display in close contact with a wall, and a display apparatus having the wall mount.

2. Description of the Related Art

Recently, many display apparatuses use high-definition and large-size displays to display content. Accordingly, slimmer and lighter displays are being developed. Also, cases of fixing a display to the wall are increasing.

A display apparatus may include a wall mount for fixing a display to the wall. To stably fix the display to the wall, the wall mount needs to be made of a material with predetermined stiffness or higher. Therefore, the wall mount has a relatively heavy weight. In addition, in the case in which the wall mount is integrated into the display apparatus, it takes time to align the wall mount when mounting the wall mount on the wall. Also, displays of various sizes require wall mounts of various sizes.

Typically, to mount a display in close contact with the wall, a groove is formed in the rear surface of the display and coupled to a wall mount. However, in this case, the design of the display is degraded.

SUMMARY

Therefore, it is an aspect of the disclosure to provide a wall mount capable of supporting displays of various sizes.

It is another aspect of the disclosure to provide a wall mount that is effective in view of inventory management.

It is another aspect of the disclosure to provide a display apparatus capable of preventing a design of a display from being degraded.

It is another aspect of the disclosure to provide a display apparatus that is effective in view of horizontal adjustment of a display.

It is another aspect of the disclosure to provide a display apparatus capable of firmly fixing a display to a wall such that the display is in close contact with the wall.

It is another aspect of the disclosure to provide a display apparatus capable of easily mounting a display on a wall mount.

Additional aspects of the disclosure will be set forth in part in the description which follows and, in part, will be obvious from the description, or may be learned by practice of the disclosure.

In accordance with an aspect of the disclosure, a wall mount includes: a first bracket mountable on a wall and coupleable to an apparatus to be mounted on the wall, a second bracket mountable on the wall and coupleable to the apparatus to be mounted on the wall, and a guide member including first, second, third and fourth guide coupling portions aligned with each other along the guide member with the third and fourth guide coupling portions between the first and second guide coupling portions, the third guide coupling portion between the first guide coupling portion and a center of the guide member, and the fourth guide coupling portion between the second guide coupling portion and the center of the guide member, wherein the first bracket is coupleable to either the first guide coupling portion or the third guide coupling portion and the second bracket is coupleable to either the second guide coupling portion or the fourth guide coupling portion, so that a distance between the first bracket and the second bracket is adjustable, and mounting positions of the first bracket and the second bracket on the wall are guidable, by the guide member when the first bracket and the second bracket are being mounted on the wall, the wall mount thereby being configured to, when the first bracket and the second bracket are mounted at the mounting positions on the wall and coupled to the apparatus, mount the apparatus on the wall.

The guide member may be made of a material that is different from a material of the first bracket or and a material of the second bracket.

The wall mount may further include a magnetic body configured to be mounted on the wall so that, when the magnetic body is mounted on the wall with the first bracket and the second bracket mounted on the wall and coupled to the apparatus, the magnetic body is positioned to correspond to a magnet on the apparatus.

The first bracket may include a first adjusting slit inclined with respect to a direction of gravity and which is coupleable with a first holder of the apparatus to couple the first bracket to the apparatus, and the second bracket may include a second adjusting slit being symmetrical to the first adjusting slit with respect to the center of the guide member and which is coupleable with a second holder of the apparatus to couple the second bracket to the apparatus.

The first fixing bracket may include: a first catching portion configured so that, when the first bracket is coupled to either the first guide coupling portion or the third guide coupling portion, the first catching portion is supported in a direction of gravity by the first guide coupling portion or the third guide coupling portion to which the first bracket is coupled; and a first limiting portion configured so that, when the first bracket is coupled to either the first guide coupling portion or the third guide coupling portion, the first limiting portion limits horizontal movement of the first guide coupling portion or the third guide coupling portion to which the first bracket is coupled.

The second fixing bracket may include: a second catching portion configured so that, when the second bracket is coupled to either the second guide coupling portion or the fourth guide coupling portion, the second catching portion is supported in a direction of gravity by the second guide coupling portion or the fourth guide coupling portion to which the second bracket is coupled; and a second limiting portion configured so that, when the second bracket is coupled to either the second guide coupling portion or the fourth guide coupling portion, the second limiting portion limits horizontal movement of the second guide coupling portion or the fourth guide coupling portion to which the second bracket is coupled.

The guide member may have a first end and a second end, with the first guide coupling portion being closer to the first end than the second guide coupling portion, and the second guide coupling portion being closer to the second end than the first guide coupling portion, the first bracket may include a first inserting portion in which the first end is insertable to allow the first bracket to be coupled to either the first guide coupling portion or the third guide coupling portion, and the second bracket may include a second inserting portion in which the second end is insertable to allow the second bracket to be coupled to either the second guide coupling portion or the fourth guide coupling.

The guide member may include an installation hole formed in the center, the first bracket may include a first hole into which a first coupling member is insertable to mount the first bracket on the wall, and the second bracket may include a second hole into which a second coupling member is insertable to mount the second bracket on the wall.

In accordance with another aspect of the disclosure, a display apparatus includes: a display; and a wall mount including: a first bracket mountable on a wall and coupleable to the display, a second bracket moutable on the wall and coupleable to the display, and a guide member coupleable to the first bracket and the second bracket so that, when the guide member is coupled to the first bracket and the second bracket, the guide member separates the first bracket and the second bracket by a distance, wherein the guide member is configured to adjust the distance so that, when the first bracket and the second bracket are being mounted on the wall, mounting positions of the first bracket and the second bracket on the wall are adjustable, the wall mount thereby being configured to, when the first bracket and the second bracket are mounted on the wall at the mounting positions and coupled to the display, mount the display on the wall.

The display may include a first holder coupleable to the first bracket to couple the first bracket to the display, and a second holder coupleable to the second bracket to couple the second bracket to the display.

The first holder and the second holder may be positioned in higher locations than a center in an up-down direction of a rear surface of the display.

The first bracket may further include a separation preventing member configured to prevent the first holder from escaping from the first bracket when the display is mounted on the wall by the wall mount, the separation preventing member including a material with elasticity.

The display apparatus may further include a handle to support the display when the display is being coupled to the first bracket and the second bracket.

The guide member may include: first, second, third and fourth guide coupling portions aligned with each other along the guide member with the third and fourth guide coupling portions between the first and second guide coupling portions, the third guide coupling portion between the first guide coupling portion and a center of the guide member, and the fourth guide coupling portion between the second guide coupling portion and the center of the guide member.

The first bracket may be coupleable to the first guide coupling portion or the third guide coupling portion to couple the guide member to the first bracket, and the second bracket may be coupleable to the second guide coupling portion or the fourth guide coupling portion to couple the guide member to the second bracket.

The guide member may be made of a material that is lighter than a material of the first bracket and a material of the second bracket.

The display may include a magnet, and the wall mount may include a magnetic body configured to be mounted on the wall so that, when the magnet body is mounted on the wall with the first bracket and the second bracket mounted on the wall and coupled to the display, the magnetic body is positioned to correspond to the magnet of the display.

The guide member may include: a guide bracket including first, second, third and fourth guide coupling portions aligned with each other along the guide member with the third and fourth guide coupling portions between the first and second guide coupling portions, the third guide coupling portion between the first guide coupling portion and a center of the guide bracket, and the fourth guide coupling portion between the second guide coupling portion and the center of the guide bracket, a first extension bracket having a first end portion coupleable to either the first guide coupling portion or the third guide coupling portion, and a second end portion coupleable to the first bracket, and a second extension bracket having a first end portion coupleable to either the second guide coupling portion or the fourth guide coupling portion, and a second end portion coupleable to the second fixing bracket.

The display may include a magnet positioned to correspond to the guide member, and the guide member may be a magnetic body.

In accordance with another aspect of the disclosure, a wall mount includes: a first bracket mountable on a wall and coupleable to a display; a second bracket mountable on the wall and coupleable to the display; and a guide member coupleable to the first bracket and the second bracket so that, when the guide member is coupled to the first bracket and the second bracket, the guide member separates the first bracket and the second bracket by a distance, wherein the guide member is configured to adjust the distance so that, when the first bracket and the second bracket are being mounted on the wall, mounting positions of the first bracket and the second bracket on the wall are adjustable, the wall mount thereby being configured to, when the first bracket and the second bracket are mounted on the wall at the mounting position and coupled to the display, mount the display on the wall.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
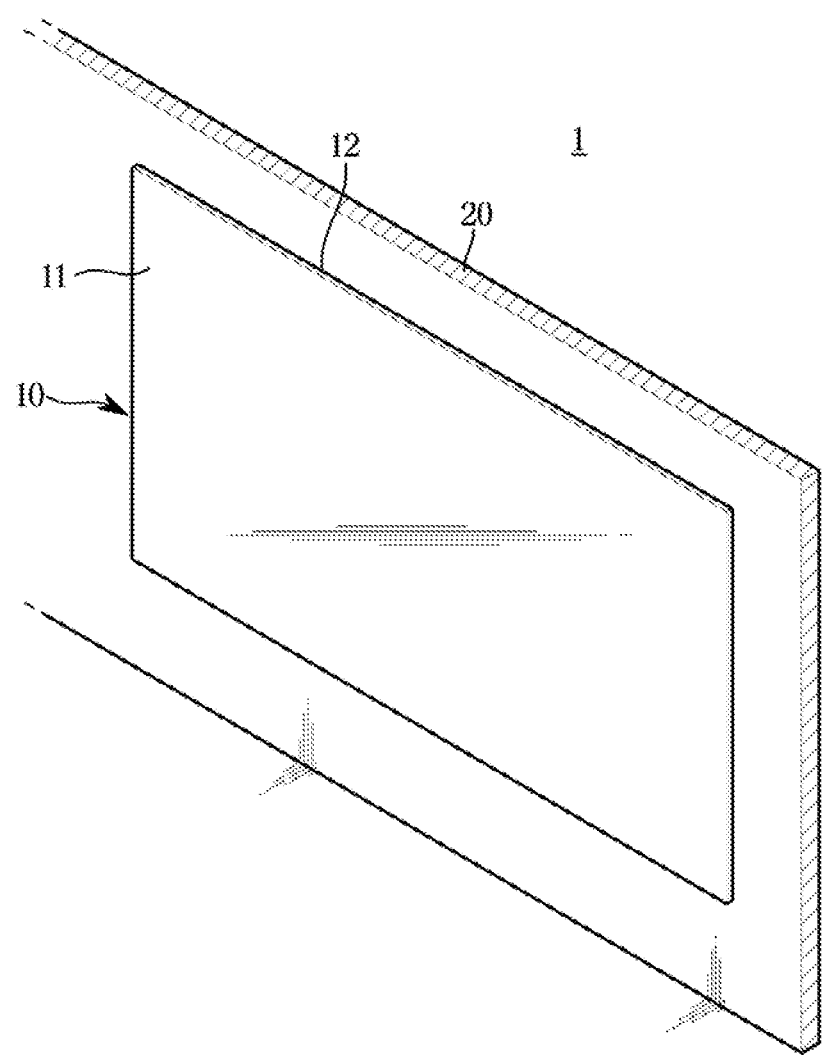
FIG. 1 shows a state in which a display of a display apparatus according to an embodiment of the disclosure is fixed to a wall.

The embodiments described in the present specification are only the preferred embodiments of the disclosure, and thus it is to be understood that various equivalents and modified examples, which may replace the embodiments, are possible when filing the present application.

It is to be understood that the singular forms "a," "an," and "the" include plural referents unless the context clearly dictates otherwise. In the drawings, for easy understanding, the shapes or sizes of components are more or less exaggeratedly shown.

It will be understood that when the terms "includes," "comprises," "including," and/or "comprising," when used in this specification, specify the presence of stated features, figures, steps, components, or combination thereof, but do not preclude the presence or addition of one or more other features, figures, steps, components, members, or combinations thereof.

Content may be displayed on a display apparatus. For example, content may include a video file or an audio file that is reproduced on a video player being one of applications, a music file that is reproduced on a music player, a photo file that is displayed in a photo gallery, a web page file that is displayed on a web browser, etc. Also, content may include a received broadcast.

Content may include a video file, an audio file, a text file, an image file, or a web page, which is displayed or executed in an application. Also, content may include a video file and/or an audio file included in received broadcast signals.

Content may include an executed application screen and a user interface configuring an application screen. Also, content may include one piece of content or a plurality of pieces of content.

An application means software that is executed on a desk-top operating system (OS), a mobile OS, or a display OS and used by a user. For example, an application may include a word processor, a spreadsheet, a contacts application, a calendar application, a memo application, an alarm application, a social network system (SNS) application, a chatting application, a map application, a music player, or a video player. Also, an application according to an embodiment of the disclosure may mean software that is executable on a display apparatus in correspondence to a received user input. Also, an application according to an embodiment of the disclosure may mean software that is downloaded from the outside of a display apparatus and executable on the display apparatus.

Also, it will be understood that, although the terms "first," "second," etc. may be used herein to describe various components, these components should not be limited by these terms. These terms are only used to distinguish one component from another. For example, a first component could be termed a second component, and, similarly, a second component could be termed a first component, without departing from the scope of the disclosure. As used herein, the term "and/or" includes any and all combinations of one or more of the associated listed items.

Throughout the disclosure, the expression "at least one of a, b or c" indicates only a, only b, only c, both a and b, both a and c, both b and c, all of a, b, and c, or variations thereof.

Hereinafter, embodiments of the present disclosure will be described in detail with reference to the accompanying drawings.

Figure 2:
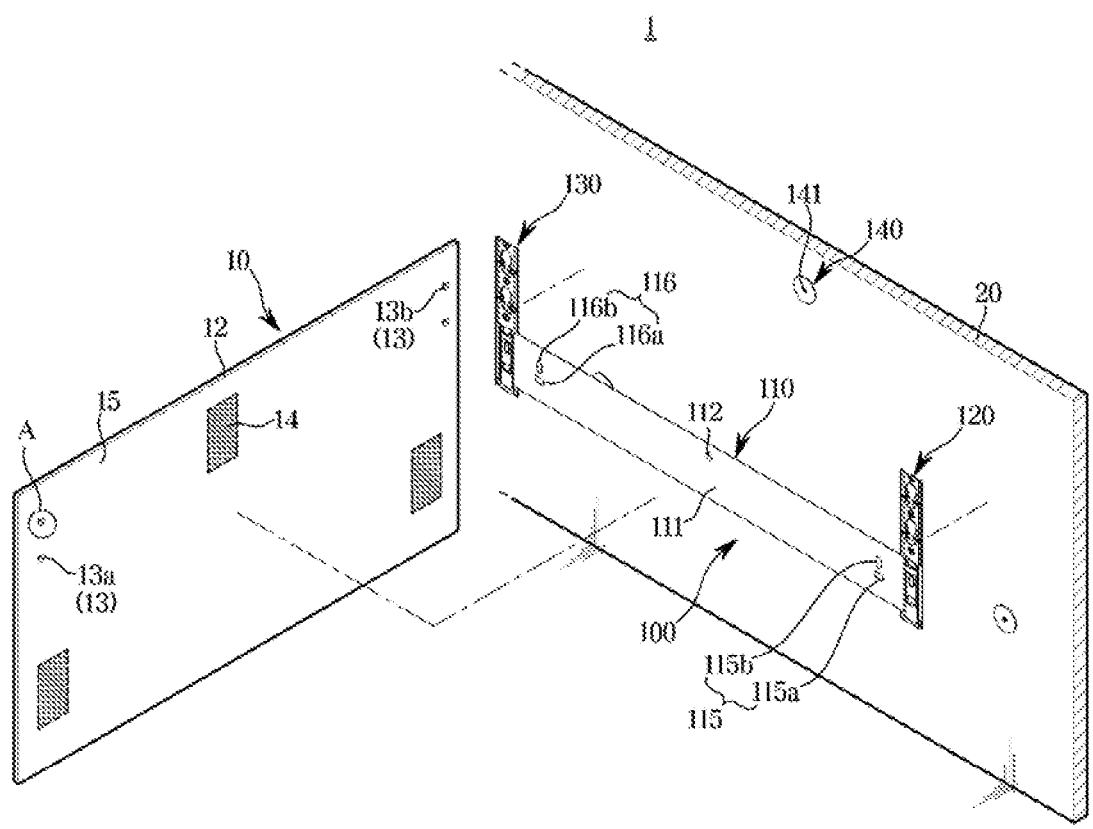
FIG. 2 is an exploded perspective view of a wall mount and the display of the display apparatus shown in FIG. 1.
Figure 3:
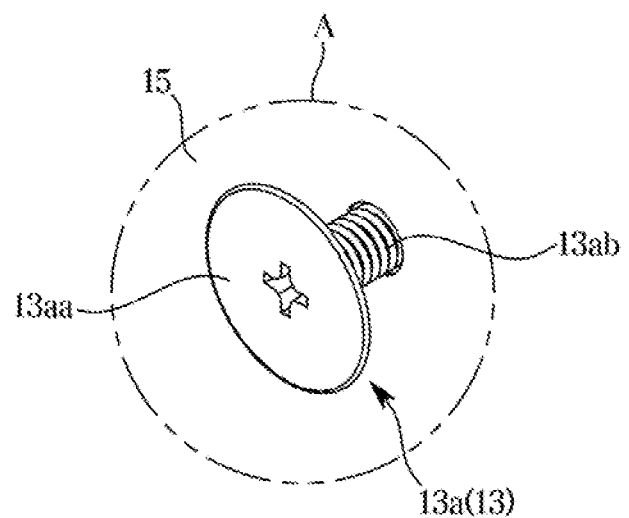
FIG. 3 is an enlarged view of an area A shown in FIG. 2.
Figure 4:
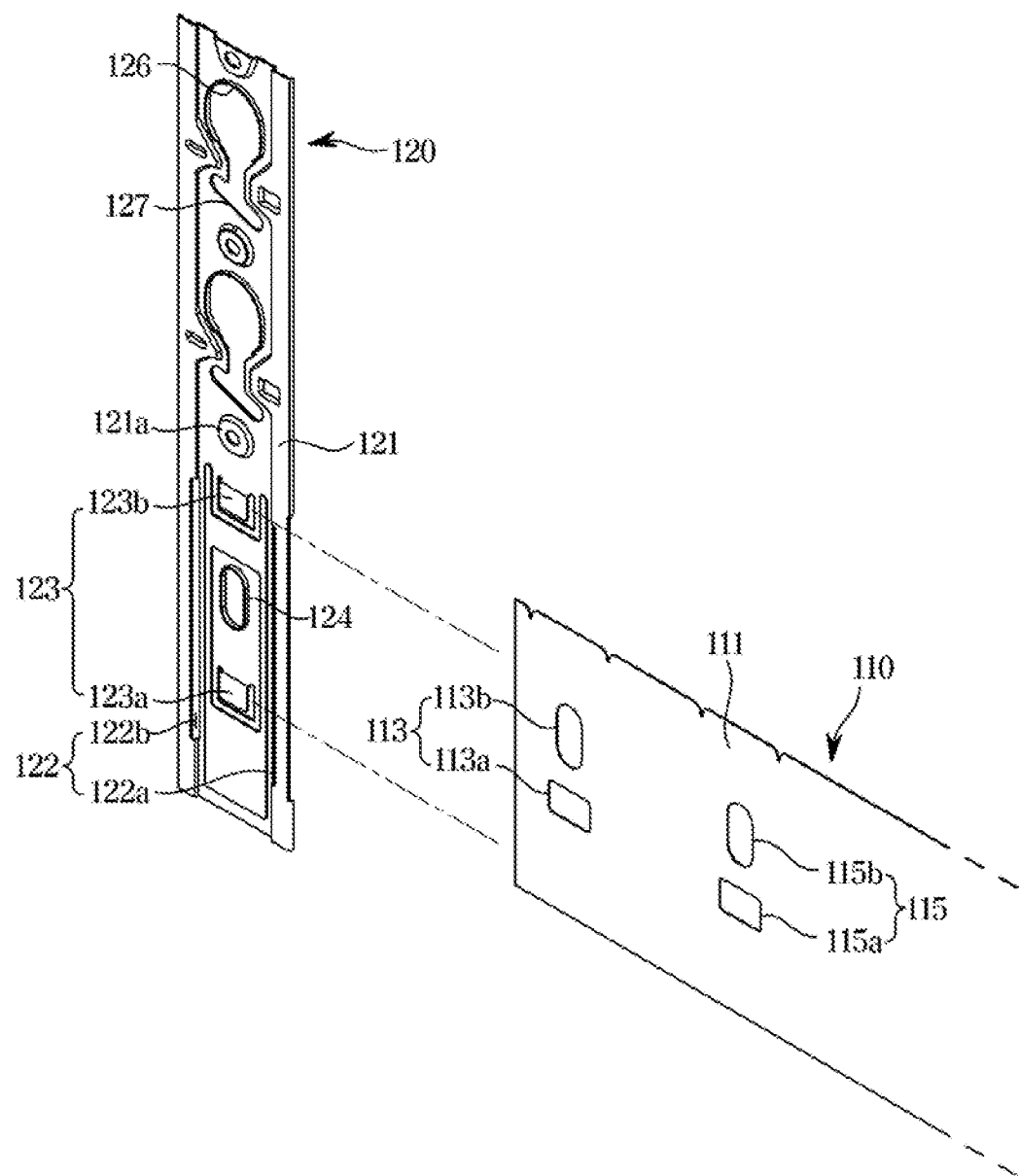
FIG. 4 shows a state in which a guide member of the wall mount shown in FIG. 2 is separated from a first fixing bracket, as seen in a rear direction.
Figure 5:
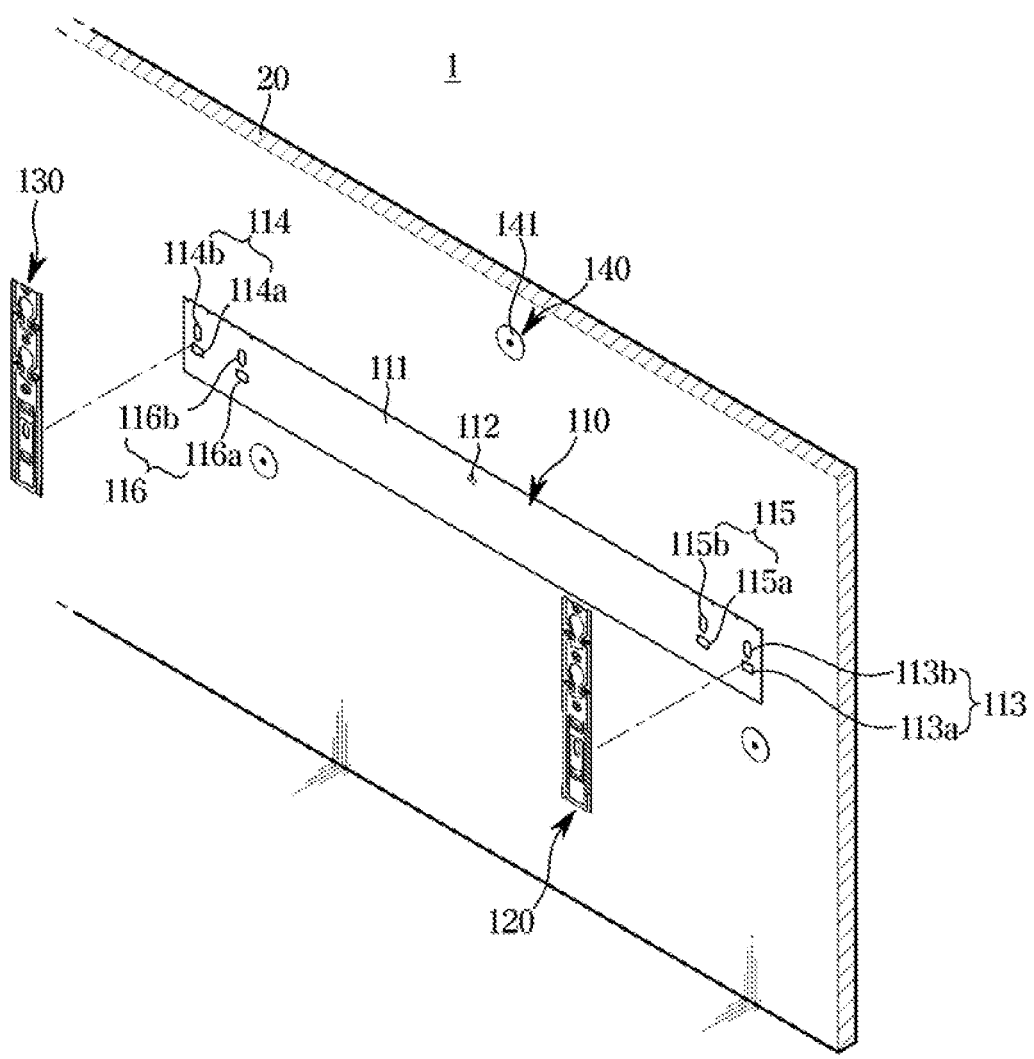
FIG. 5 is a view for describing an operation of mounting a wall mount on a wall shown in FIG. 2.
Figure 6:
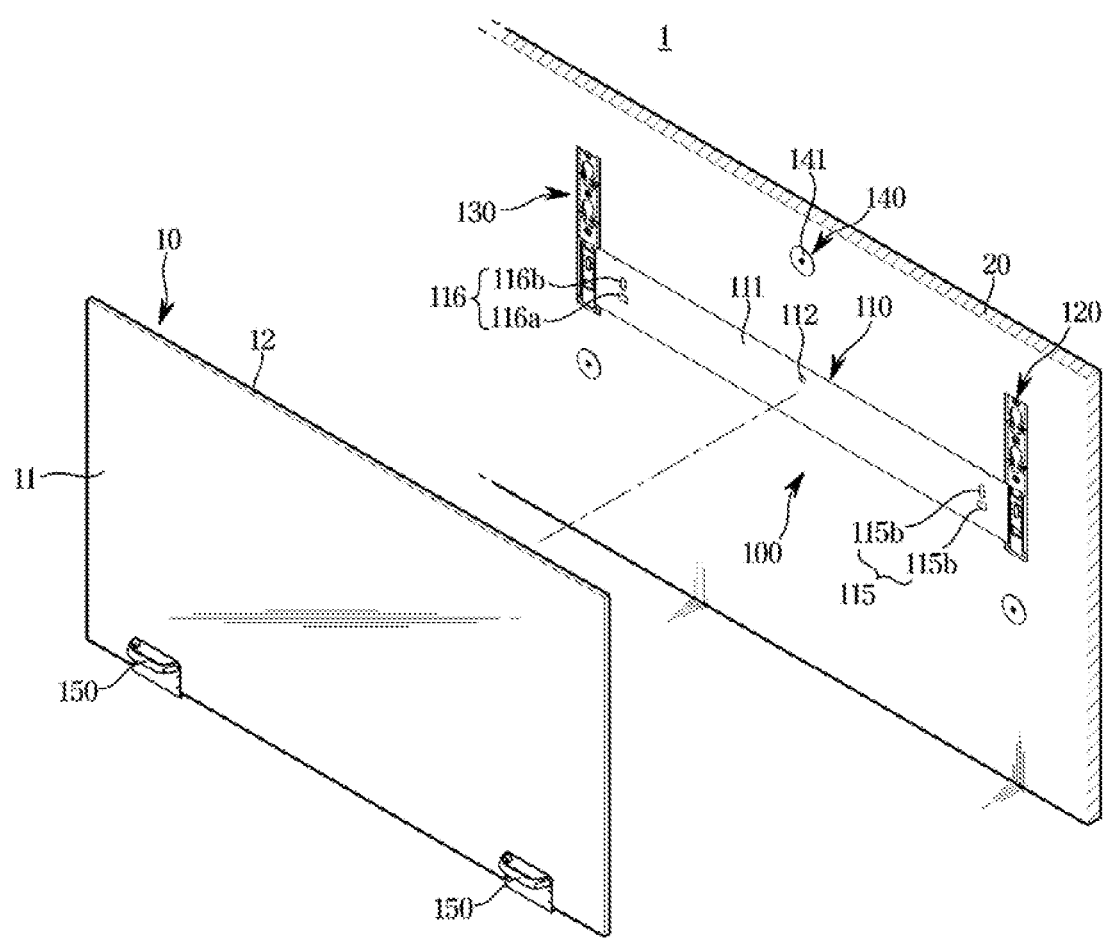
FIG. 6 is a view for describing an operation of mounting a display on the wall mount after the wall mount shown in FIG. 5 is mounted on the wall.

FIG. 1 shows a state in which a display of a display apparatus according to an embodiment of the disclosure is fixed to a wall. FIG. 2 is an exploded perspective view of a wall mount and the display of the display apparatus shown in FIG. 1. FIG. 3 is an enlarged view of an area A shown in FIG. 2. FIG. 4 shows a state in which a guide member of the wall mount shown in FIG. 2 is separated from a first fixing bracket, as seen in a rear direction. FIG. 5 is a view for describing an operation of mounting a wall mount on a wall shown in FIG. 2. FIG. 6 is a view for describing an operation of mounting a display on the wall mount after the wall mount shown in FIG. 5 is mounted on the wall.

Referring to FIGS. 1 and 2, a display apparatus 1 according to an embodiment of the disclosure will be described. Hereinafter, the display apparatus 1 is assumed to include a display 10 and a wall mount 100.

Referring to FIGS. 1 and 2, the display apparatus 1 may include the display 10 for displaying content, and the wall mount 100 for fixing the display 10 to a wall. It will be easily understood to one of ordinary skill in the art that components included in the display apparatus 1 may change when the display apparatus 1 is slimmed.

The display 10 may include a display panel 11 on which content is displayed, and include a side frame 12 supporting at least one of side portions of the display panel 11. The display 10 may be a kind of output apparatus that visually and/or aurally outputs content, and the display panel 11 may include a liquid crystal panel, a light-emitting diode (LED) panel, or an organic LED panel. The display 10 may be mounted on a wall 20 by a wall mount 100 due to its thin thickness. The display 10 may be supported by the wall mount 100.

Referring to FIG. 2, the display 10 may include a holder 13 and a magnet 14 through which the display 10 is supported by the wall mount 100.

The holder 13 may include a first holder 13a supported on a first fixing bracket 120, and a second holder 13b supported on a second fixing bracket 130. At least one first holder 13a may be positioned in one edge of a rear surface 15 of the display 10. At least one second holder 13b may be positioned in the other edge of the rear surface 15 of the display 10, the other edge being opposite to the one edge. The second holder 13b may be symmetrical to the first holder 13a with respect to a center in left-right direction of the display 10. The first holder 13a and the second holder 13b may be positioned in higher locations than a center in up-down direction of the rear surface 15 of the display 10. The second holder 13b may have the same configuration as the first holder 13a, and therefore, for convenience of description, the first holder 13a will be described and a description about the second holder 13b will be omitted.

Referring to FIG. 3, the first holder 13a may include a holder head 13aa and a holder body 13ab. In the holder body 13ab, a thread may be formed. The holder body 13ab may be screwed in the rear surface 15 of the display 10. The holder body 13ab may be coupled to the rear surface 15 of the display 10 such that the holder head 13aa is spaced a predetermined distance from the rear surface 15 of the display 10. A portion of the holder body 13ab between the holder head 13aa and the rear surface 15 of the display 10 may be supported by the fixing brackets 120 and 130 when the display 10 is mounted on the wall mount 100.

The magnet 14 may be positioned in the inside of the display 10. The magnet 14 may be positioned in an arbitrary location spaced from the holder 13. The magnet 14 may enable a portion of the rear surface 15 of the display 10 on which no holder 13 is positioned to be fixed to the wall mount 100. In FIG. 2, three magnets 14 are shown, however, the number of the magnets 14 is not limited to three.

Referring to FIG. 2, the wall mount 100 may be fixed to the wall 20. The wall mount 100 may include a guide member 110 and the fixing brackets 120 and 130. The fixing brackets 120 and 130 may include the first fixing bracket 120 and the second fixing bracket 130. The guide member 110 may adjust a space between the first fixing bracket 120 and the second fixing bracket 130.

The guide member 110 may include a guide body 111. The guide body 111 may be made of a flexible material. The guide body 111 may be made of polycarbonate (PC). The guide body 111 may include a material that is lighter than a material of the fixing brackets 120 and 130. The guide member 110 is mainly aimed to guide installation locations of the fixing brackets 120 and 130, and has little influence in supporting the fixing brackets 120 and 130. Therefore, by forming the guide member 110 with a material of relatively lower cost than the fixing brackets 120 and 130, it may be possible to reduce product cost, and by forming the guide member 110 with a relatively light material, it may be possible to facilitate transport and installation.

The guide body 111 may include an installation hole 112 formed in the substantially center portion. When a coupling member (not shown) is coupled to the installation hole 112, the guide body 111 may be fixed to the wall 20.

Referring to FIGS. 2, 4 and 5, the guide member 110 may include a first guide coupling portion 113, a second guide coupling portion 114, a third guide coupling portion 115, and a fourth guide coupling portion 116. As can be seen from the figures, the a first guide coupling portion 113, the second guide coupling portion 114, the third guide coupling portion 115, and the fourth guide coupling portion 116 are aligned with each other along the guide member 110 with the third guide coupling portion 115 and the fourth guide coupling portion 116 between the first guide coupling portion 113 and the second guide coupling portion 114.

The first guide coupling portion 113 may be positioned in one end portion of the guide body 111. The first guide coupling portion 113 may be coupled to the first fixing bracket 120. The first guide coupling portion 113 may include a 1a-th fixing portion 113a and a 1b-th fixing portion 113b. The 1a-th fixing portion 113a and the 1b-th fixing portion 113b may penetrate the guide body 111.

The 1a-th fixing portion 113a may be coupled to a 1a-th catching portion 123a of the first fixing bracket 120. When the 1a-th fixing portion 113a is coupled to the 1a-th catching portion 123a, the 1a-th fixing portion 113a may support the 1a-th catching portion 123a in the direction of gravity. When the 1a-th fixing portion 113a is coupled to the 1a-th catching portion 123a, the 1a-th fixing portion 113a may limit horizontal movements of the 1a-th catching portion 123a.

The 1b-th fixing portion 113b may be coupled to a first limiting portion 124 of the first fixing bracket 120. When the 1b-th fixing portion 113b is coupled to the first limiting portion 124, the 1b-th fixing portion 113b may limit horizontal movements of the first limiting portion 124. When the 1b-th fixing portion 113b is coupled to the first limiting portion 124, the 1b-th fixing portion 113b may support the first limiting portion 124 in the direction of gravity.

The second guide coupling portion 114 may be positioned in the other end portion of the guide body 111, which is opposite to the one end portion of the guide body 111. The second guide coupling portion 114 may be symmetrical to the first guide coupling portion 113. The second guide coupling portion 114 may be able to be coupled to the second fixing bracket 130. The second guide coupling portion 114 may include a 2a-th fixing portion 114a and a 2b-th fixing portion 114b. The 2a-th fixing portion 114a and the 2b-th fixing portion 114b may penetrate the guide body 111.

The 2a-th fixing portion 114a may be coupled to a 2a-th catching portion 133a (see FIG. 8) of the second fixing bracket 130. When the 2a-th fixing portion 114a is coupled to the 2a-th catching portion 133a, the 2a-th fixing portion 114a may support the 2a-th catching portion 133a in the direction of gravity. When the 2a-th fixing portion 114a is coupled to the 2a-th catching portion 133a, the 2a-th fixing portion 114a may limit horizontal movements of the 2a-th catching portion 133a.

The 2b-th fixing portion 114b may be coupled to a second limiting portion 134 (see FIG. 7) of the second fixing bracket 130. When the 2b-th fixing portion 114b is coupled to the second limiting portion 134, the 2b-th fixing portion 114b may limit horizontal movements of the second limiting portion 134. When the 2b-th fixing portion 114b is coupled to the second limiting portion 134, the 2b-th fixing portion 114b may support the second limiting portion 134 in the direction of gravity.

The third guide coupling portion 115 may be positioned between the first guide coupling portion 113 and the installation hole 112. The third guide coupling portion 115 may be able to be coupled to the first fixing bracket 120. The third guide coupling portion 115 may include a 3a-th fixing portion 115a and a 3b-th fixing portion 115b. The 3a-th fixing portion 115a and the 3b-th fixing portion 115b may penetrate the guide body 111.

The 3a-th fixing portion 115a may be coupled to the 1a-th catching portion 123a of the first fixing bracket 120. When the 3a-th fixing portion 115a is coupled to the 1a-th catching portion 123a, the 3a-th fixing portion 115a may support the 1a-th catching portion 123a in the direction of gravity. When the 3a-th fixing portion 115a is coupled to the 1a-th catching portion 123a, the 3a-th fixing portion 115a may limit horizontal movements of the 1a-th catching portion 123a.

The 3b-th fixing portion 115b may be coupled to the first limiting portion 124 of the first fixing bracket 120. When the 3b-th fixing portion 115b is coupled to the first limiting portion 124, the 3b-th fixing portion 115b may limit horizontal movements of the first limiting portion 124. When the 3b-th fixing portion 115b is coupled to the first limiting portion 124, the 3b-th fixing portion 115b may support the first limiting portion 124 in the direction of gravity.

The fourth guide coupling portion 116 may be positioned between the second guide coupling portion 114 and the installation hole 112. The fourth guide coupling portion 116 may be symmetrical to the third guide coupling portion 115. The fourth guide coupling portion 116 may be able to be coupled to the second fixing bracket 130. The fourth guide coupling portion 116 may include a 4a-th fixing portion 116a and a 4b-th fixing portion 116b. The 4a-th fixing portion 116a and the 4b-th fixing portion 116b may penetrate the guide body 111.

The 4a-th fixing portion 116a may be coupled to the 2a-th catching portion 133a (see FIG. 8) of the second fixing bracket 130. When the 4a-th fixing portion 116a is coupled to the 2a-th catching portion 133a, the 4a-th fixing portion 116a may support the 2a-th catching portion 133a in the direction of gravity. When the 4a-th fixing portion 116a is coupled to the 2a-th catching portion 133a, the 4a-th fixing portion 116a may limit horizontal movements of the 2a-th catching portion 133a.

The 4b-th fixing portion 116b may be coupled to the second limiting portion 134 (see FIG. 7) of the second fixing bracket 130. When the 4b-th fixing portion 116b is coupled to the second limiting portion 134, the 4b-th fixing portion 116b may limit horizontal movements of the second limiting portion 134. When the 4b-th fixing portion 116b is coupled to the second limiting portion 134, the 4b-th fixing portion 116b may support the second limiting portion 134 in the direction of gravity.

The first fixing bracket 120 may be coupled to the first guide coupling portion 113 or the third guide coupling portion 115. The first fixing bracket 120 may support one end portion of the display 10. The first fixing bracket 120 may include a material that is different from that of the guide member 110. The first fixing bracket 120 may include a material with predetermined stiffness or higher to support the display 10. The first fixing bracket 120 may be made of a steel plate.

The first fixing bracket 120 may include a first bracket body 121. In the first bracket body 121, a first fixing hole 121a may be formed to which a coupling member is coupled when the first bracket body 121 is fixed to a wall.

The first fixing bracket 120 may include a first inserting portion 122 in which one end portion of the guide member 110 is inserted. The first inserting portion 122 may be formed in the shape of a slit in the first bracket body 121. When the guide member 110 is inserted in the first inserting portion 122, the first inserting portion 122 may support the guide member 110 in the direction of gravity. The first inserting portion 122 may include a 1a-th inserting portion 122a and a 1b-th inserting portion 122b spaced from the 1a-th inserting portion 122a. The guide member 110 may penetrate the first bracket body 121 through the 1a-th inserting portion 122a to be inserted in the 1a-th inserting portion 122a from the front side of the first bracket body 121 to the rear side of the first bracket body 121 so that the guide member 110 intersects with the first bracket body 121, and penetrate the first bracket body 121 through the 1b-th inserting portion 122b to be inserted in the 1b-th inserting portion 122b from the rear side of the first bracket body 121 to the front side of the first bracket body 121 so that the guide member 110 intersects with the first bracket body 121. When the guide member 110 is inserted in the 1a-th inserting portion 122a and the 1b-th inserting portion 122b, the guide member 110 may support the first bracket body 121 in the direction of gravity.

The first fixing bracket 120 may include a first catching portion 123 bent to be coupled to the guide member 110. The first catching portion 123 may have a shape protruding backward from a rear surface of the first bracket body 121 and then bent downward. The first catching portion 123 may include the 1a-th catching portion 123a and a 1b-th catching portion 123b positioned above the 1a-th catching portion 123a.

The 1a-th catching portion 123a may be able to be coupled to the 1a-th fixing portion 113a or the 3a-th fixing portion 115a. The 1a-th catching portion 123a may pass through the 1a-th fixing portion 113a or the 3a-th fixing portion 115a, and then, when the guide member 110 moves upward with respect to the first fixing bracket 120, the 1a-th catching portion 123a may be coupled to the 1a-th fixing portion 113a or the 3a-th fixing portion 115a.

The 1a-th catching portion 123a may be coupled to the 1a-th fixing portion 113a or the 3a-th fixing portion 115a, according to a position at which one end portion of the guide member 110 is inserted in the first inserting portion 122. When the 1a-th catching portion 123a is coupled to the 1a-th fixing portion 113a or the 3a-th fixing portion 115a, the 1a-th catching portion 123a may be supported by the 1a-th fixing portion 113a or the 3a-th fixing portion 115a in the direction of gravity. Also, when the 1a-th catching portion 123a is coupled to the 1a-th fixing portion 113a or the 3a-th fixing portion 115a, horizontal movements of the 1a-th catching portion 123a may be limited by the 1a-th fixing portion 113a or the 3a-th fixing portion 115a.

The 1b-th catching portion 123b may be caught by an upper end of the guide body 111. When the 1a-th catching portion 123a is coupled to the 1a-th fixing portion 113a or the 3a-th fixing portion 115a, the 1b-th catching portion 123b may be caught by the upper end of the guide body 111 to be supported by the upper end of the guide body 111 in the direction of gravity.

The first fixing bracket 120 may include a first limiting portion 124 which is coupled to the guide member 110. The first limiting portion 124 may protrude backward from the rear surface of the first bracket body 121. The first limiting portion 124 may be formed with a size and/or shape corresponding to the 1b-th fixing portion 113b or the 3b-th fixing portion 115b of the guide member 110. The first limiting portion 124 may be able to be inserted in the 1b-th fixing portion 113b or the 3b-th fixing portion 115b. The first limiting portion 124 may be coupled to the 1b-th fixing portion 113b or the 3b-th fixing portion 115b, according to a position at which one end portion of the guide member 110 is inserted in the first inserting portion 122. When the first limiting portion 124 is coupled to the 1b-th fixing portion 113b or the 3b-th fixing portion 115b, horizontal movements of the first limiting portion 124 may be limited by the 1b-th fixing portion 113b or the 3b-th fixing portion 115b. Also, when the first limiting portion 124 is coupled to the 1b-th fixing portion 113b or the 3b-th fixing portion 115b, the first limiting portion 124 may be supported by the 1b-th fixing portion 113b or the 3b-th fixing portion 115b in the direction of gravity.

The first fixing bracket 120 may include a first through opening 126 through which the holder head 13aa of the first holder 13a of the display 10 is able to pass. The first through opening 126 may penetrate the first bracket body 121. The first through opening 126 may be larger than the holder head 13aa of the first holder 13a. A number of the first through opening 126 may correspond to a number of the first holder 13a.

The first fixing bracket 120 may include a first adjusting slit 127 for supporting the first holder 13a passed through the first through opening 126. The first adjusting slit 127 may extend from a lower area of the first through opening 126. The first adjusting slit 127 may be smaller than the holder head 13aa of the first holder 13a. Accordingly, in the wall mount 100 according to an embodiment of the disclosure, when the first holder 13a is positioned in the first adjusting slit 127, the first holder 13a may be prevented from escaping from the first adjusting slit 127.

The first adjusting slit 127 may be inclined with respect to the direction of gravity. The first adjusting slit 127 may adjust a horizontal level of the display 10 mounted on the wall mount 100 together with a second adjusting slit 137 of the second fixing bracket 130. To adjust the horizontal level of the display 10, the first adjusting slit 127 may be symmetrical to the second adjusting slit 137. As shown in FIG. 4, the first adjusting slit 127 may be inclined upward toward a direction that is spaced away from the guide member 110. However, when the first adjusting slit 127 is symmetrical to the second adjusting slit 137, the first adjusting slit 127 may be inclined in a direction that is different from that shown in FIG. 4. A process of adjusting a horizontal level of the display 10 mounted on the wall mount 100 will be described in detail, later.

The second fixing bracket 130 may be coupled to the second guide coupling portion 114 or the fourth guide coupling portion 116. The second fixing bracket 130 may support the other end portion of the display 10, which is opposite to one end portion of the display 10 supported by the first fixing bracket 120. The second fixing bracket 130 may be made of a material that is different from that of the guide member 110. The second fixing bracket 130 may include a material with predetermined stiffness or higher to support the display 10. The second fixing bracket 130 may be made of a steel plate.

The second fixing bracket 130 may be symmetrical to the first fixing bracket 120. The second fixing bracket 130 may have the same configuration as the first fixing bracket 120. The second fixing bracket 130 may include a second bracket body 131 (see FIG. 7), a second inserting portion 132 (see FIG. 7), a second catching portion 133 (see FIG. 8), the second limiting portion 134 (see FIG. 7), a second through opening 136 (see FIG. 7), and the second adjusting slit 137 (see FIG. 7).

The second bracket body 131 may correspond to the first bracket body 121. In the second bracket body 131, a second fixing hole 131a may be formed to which a coupling member (not shown) is coupled when the second bracket body 131 is fixed to the wall 20.

The second inserting portion 132 may include a 2a-th inserting portion 132a (see FIG. 7) and a 2b-th inserting portion 132b (see FIG. 7) to correspond to the first inserting portion 122. The other end portion of the guide member 110, which is opposite to the one end portion of the guide member 110 inserted in the first inserting portion 122, may be inserted in the second inserting portion 132.

The second catching portion 133 may include a 2a-th catching portion 133a (see FIG. 8) and a 2b-th catching portion 133b (see FIG. 8) to correspond to the first catching portion 123. The second catching portion 133 may be coupled to the second guide coupling portion 114 or the fourth guide coupling portion 116. The second catching portion 133 may be supported by the second guide coupling portion 114 or the fourth guide coupling portion 116 in the direction of gravity.

The second limiting portion 134 may correspond to the first limiting portion 124. The second limiting portion 134 may be coupled to the second guide coupling portion 114 or the fourth guide coupling portion 116. Horizontal movements of the second limiting portion 134 may be limited by the second guide coupling portion 114 or the fourth guide coupling portion 116.

The second through opening 136 may correspond to the first through opening 126.

The second adjusting slit 137 may correspond to the first adjusting slit 127, and particularly, the second adjusting slit 137 may have a shape that is symmetrical to the first adjusting slit 127 with respect to the guide member 110 of the wall mount 100.

The wall mount 100 may further include a third fixing bracket 140. The third fixing bracket 140 may be a magnetic body. The third fixing bracket 140 may be positioned to correspond to the magnet 14 provided in the display 10. The third fixing bracket 140 may be fixed to the wall 20 when a coupling member is coupled to the third fixing hole 141.

Referring to FIGS. 4 to 6, a process of installing the display apparatus 1 according to an embodiment of the disclosure will be described.

Referring to FIG. 5, the guide member 110 may be mounted on the wall 20.

When a coupling member (not shown) penetrates the installation hole 112 to be fixed to the wall 20, the guide member 110 may be fixed to the wall 20.

Then, the first fixing bracket 120 and the second fixing bracket 130 may be coupled to both end portions of the guide member 110 mounted on the wall 20. FIGS. 5 and 6 show a case in which the first fixing bracket 120 is coupled to the first guide coupling portion 113 and the second fixing bracket 130 is coupled to the second guide coupling portion 114.

Referring to FIG. 4, one end portion of the guide member 110 may pass through the 1a-th inserting portion 122a and the 1b-th inserting portion 122b of the first fixing bracket 120, sequentially, to be coupled to the first bracket body 121. At this time, the 1a-th catching portion 123a may be positioned to correspond to the 1a-th fixing portion 113, and the first limiting portion 124 may be inserted in the 1b-th fixing portion 113b. Then, the first fixing bracket 120 may be lowered so that the 1a-th catching portion 123a is supported by the 1a-th fixing portion 113. Accordingly, the 1b-th catching portion 123b may be supported by the upper end of the guide body 111.

Thereafter, when a coupling member (not shown) penetrates the first fixing hole 121a to be fixed to the wall 20, the first fixing bracket 120 may be fixed to the wall 20.

The second fixing bracket 130 may be coupled to the guide coupling portion 114 of the guide member 110 in the same manner as the first fixing bracket 120.

After the guide member 110, the first fixing bracket 120, and the second fixing bracket 130 are mounted on the wall 20, the third fixing bracket 140 may be fixed to the wall 20. When a coupling member (not shown) penetrates the third fixing hole 141 to be fixed to the wall 20, the third fixing bracket 140 may be fixed to the wall 20. However, the third fixing bracket 140 may be mounted on the wall 20 before the first fixing bracket 120 and the second fixing bracket 130 are mounted on the wall 20.

Referring to FIG. 6, the display apparatus 1 may further include a handle 150 for supporting the display 10 when the display 10 is mounted on the wall mount 100. Because the handle 150 is a configuration for mounting the display 10, the handle 150 may be included in the wall mount 100. An installer may move the display 10 to the wall mount 100 while supporting the display 10 through the handle 150. By using the handle 150, the installer may stably and easily mount the display 10 on the wall mount 100.

The first holder 13a of the display 10 may pass through the first through opening 126 of the first fixing bracket 120, and then fall by gravity to be supported by the first adjusting slit 127. The second holder 13b of the display 10 may pass through the second through opening 136 of the second fixing bracket 130, and then fall by gravity to be supported by the second adjusting slit 137.

Figure 7:
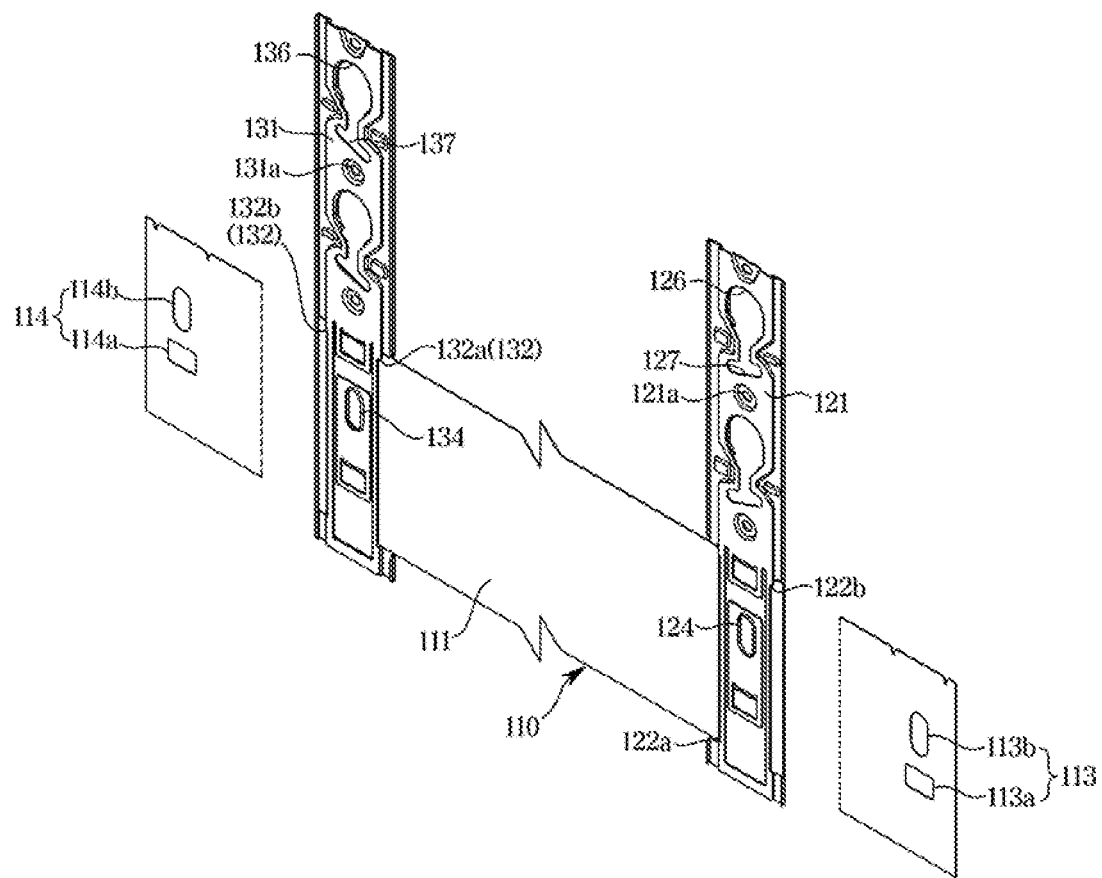
FIG. 7 shows a state in which the wall mount shown in FIG. 4 supports a display of a size that is different from that of the display shown in FIG. 6.

FIG. 7 shows a state in which the wall mount shown in FIG. 4 supports a display of a size that is different from that of the display shown in FIG. 6.

Referring to FIG. 7, when a display having a size that is smaller than that of the display 10 shown in FIG. 6 is mounted on the wall 20, the fixing brackets 120 and 130 of the wall mount 100 may be coupled to other portions of the guide member 110, which are different from portions at which the fixing brackets 120 and 130 are coupled to the guide member 110 as shown in FIG. 6.

More specifically, referring to FIGS. 6 and 7, the first fixing bracket 120 may be coupled to the third guide coupling portion 115 of the guide member 110, and the second fixing bracket 130 may be coupled to the fourth guide coupling portion 116 of the guide member 110. Also, a portion of the guide member 110 in which the first guide coupling portion 113 is formed and a portion of the guide member 110 in which the second guide coupling portion 114 is formed may be cut off. Accordingly, both end portions of the guide member 110 may be prevented from protruding to both sides of the display to be exposed to the outside.

As such, because the wall mount 100 of the display apparatus 1 according to an embodiment of the disclosure is able to be coupled to the fixing brackets 120 and 130 at various locations, the wall mount 100 may support displays of various sizes. Accordingly, the wall mount 100 of the display apparatus 1 according to an embodiment of the disclosure may be effective in view of inventory management and reduce product cost.

Figure 8:
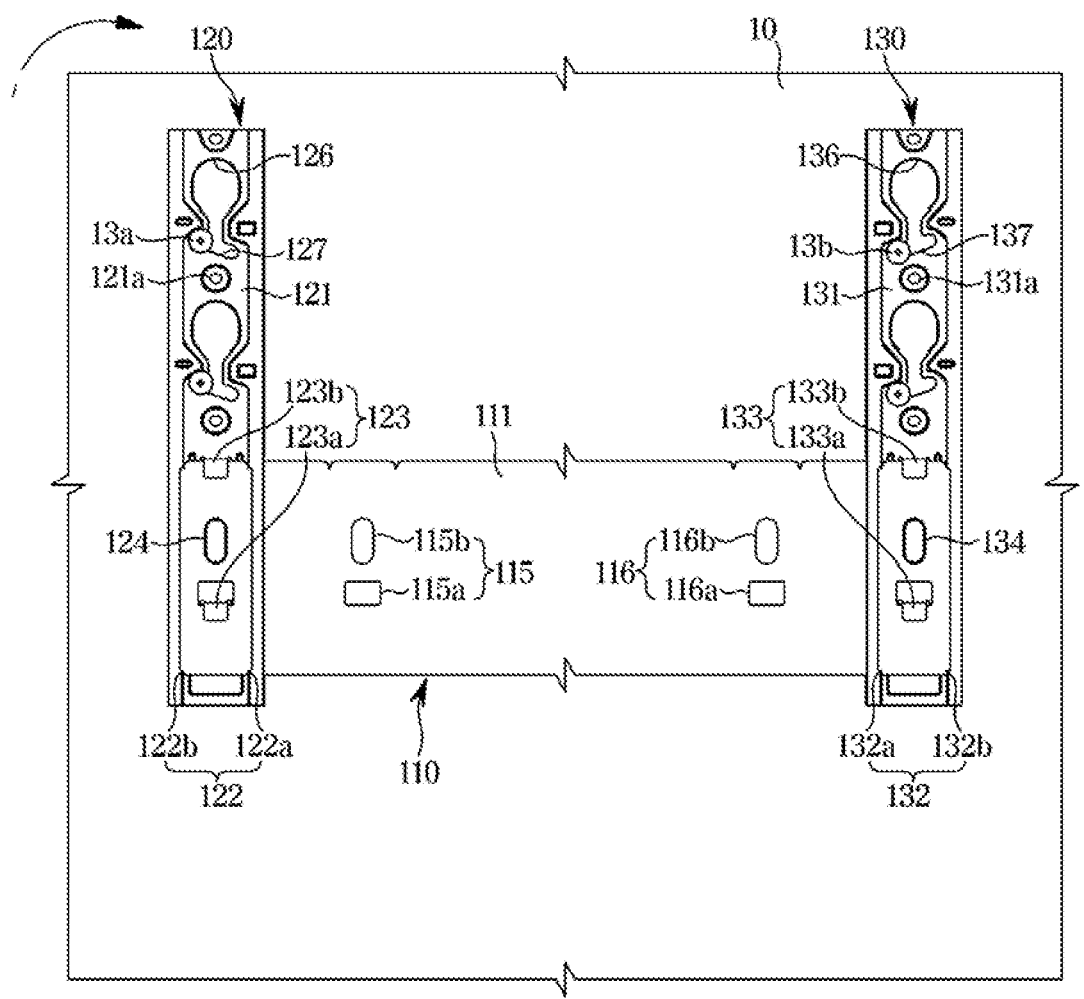
FIG. 8 is a view for describing an operation of rotating the display in a first direction to adjust a horizontal level of the display when the display is fixed to the wall mount as shown in FIG. 2.
Figure 9:
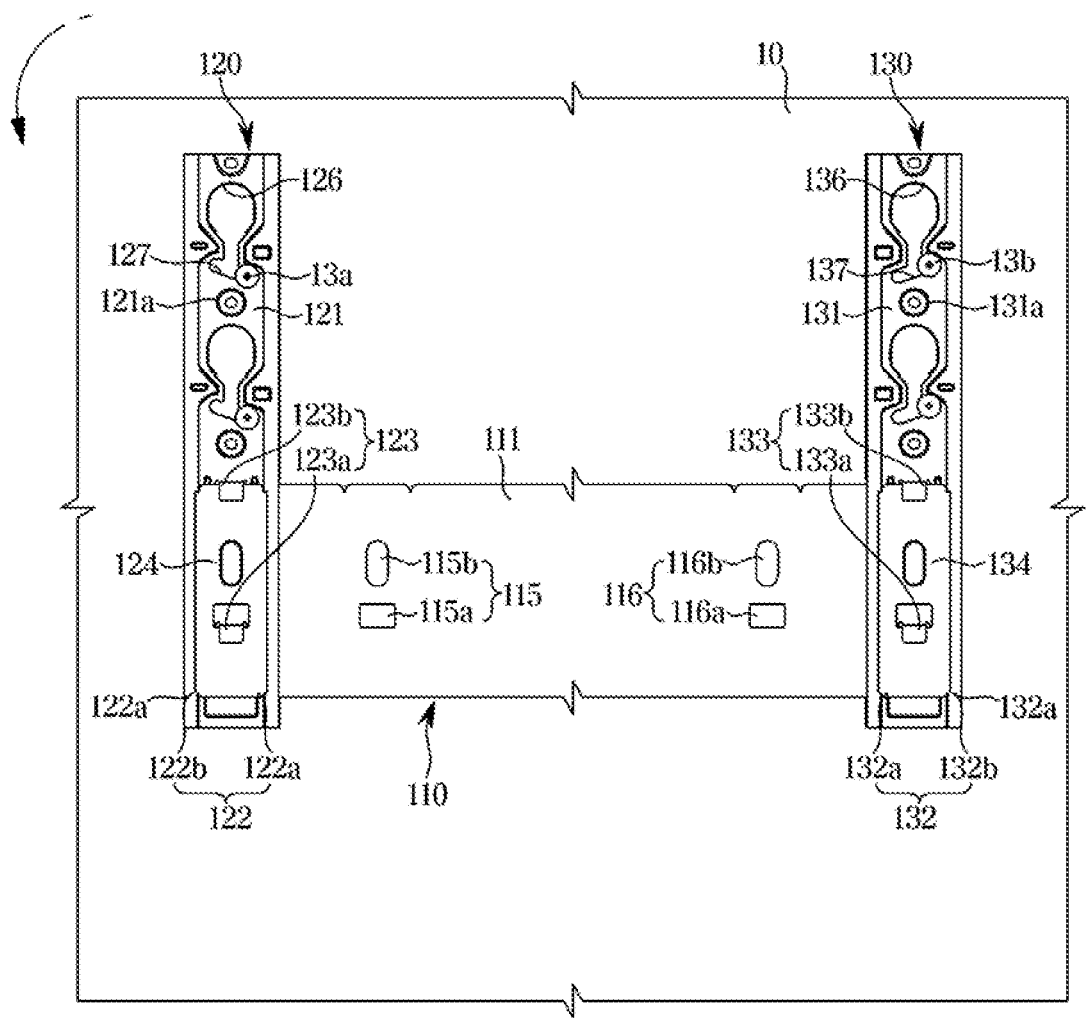
FIG. 9 is a view for describing an operation of rotating the display in a second direction to adjust a horizontal level of the display when the display is fixed to the wall mount as shown in FIG. 2.

FIG. 8 is a view for describing an operation of rotating the display in a first direction to adjust a horizontal level of the display when the display is fixed to the wall mount as shown in FIG. 2. FIG. 9 is a view for describing an operation of rotating the display in a second direction to adjust a horizontal level of the display when the display is fixed to the wall mount as shown in FIG. 2.

Referring to FIGS. 8 and 9, a process of adjusting a horizontal level of the display 10 after the display 10 according to an embodiment of the disclosure is mounted on the wall mount 100 will be described.

Referring to FIG. 8, when the display 10 mounted on the wall mount 100 rotates in the first direction to adjust a horizontal level, the first holder 13a may move upward along the first adjusting slit 127 and the second holder 13b may move downward along the second adjusting slit 137.

Meanwhile, referring to FIG. 9, when the display 10 mounted on the wall mount 100 rotates in the second direction to adjust a horizontal level, the first holder 13a may move downward along the first adjusting slit 127 and the second holder 13b may move upward along the second adjusting slit 137.

According to the configuration, the display apparatus 1 according to an embodiment of the disclosure may easily adjust a horizontal level of the display 10 through a relatively simple configuration.

Figure 10:
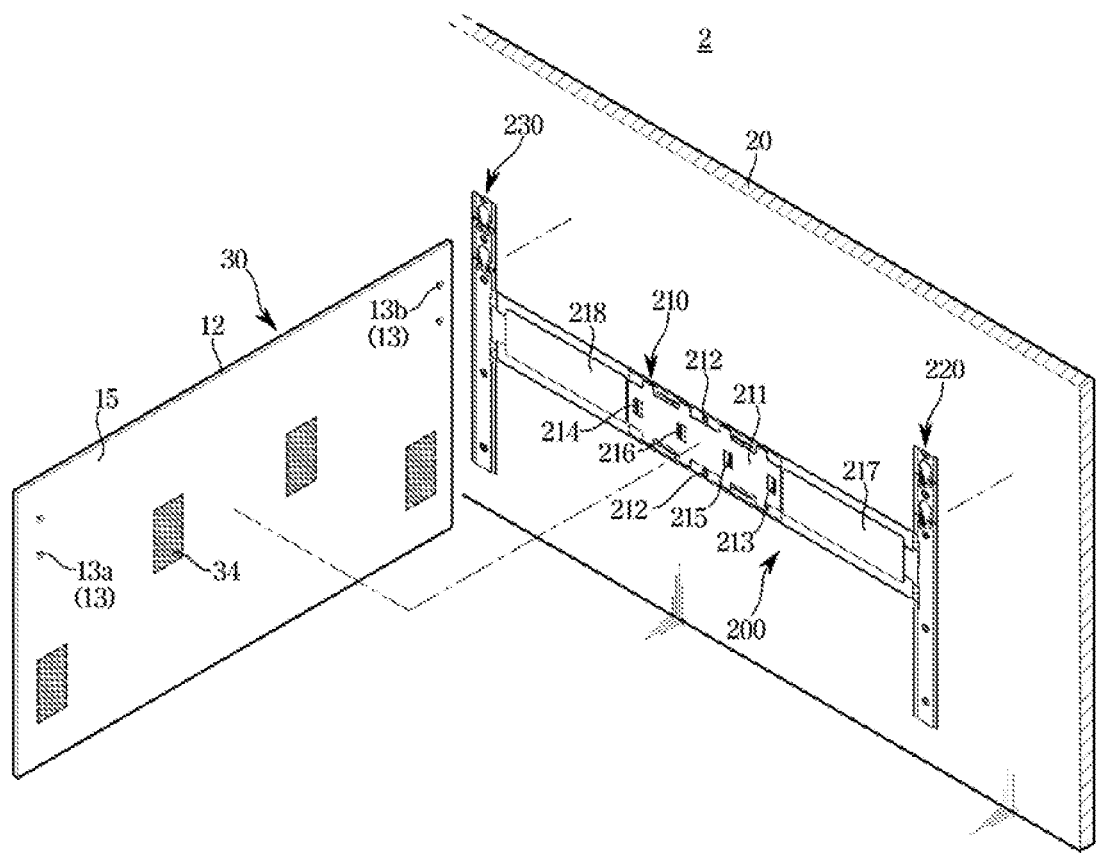
FIG. 10 is an exploded perspective view of a wall mount and a display of a display apparatus according to another embodiment of the disclosure.
Figure 11:
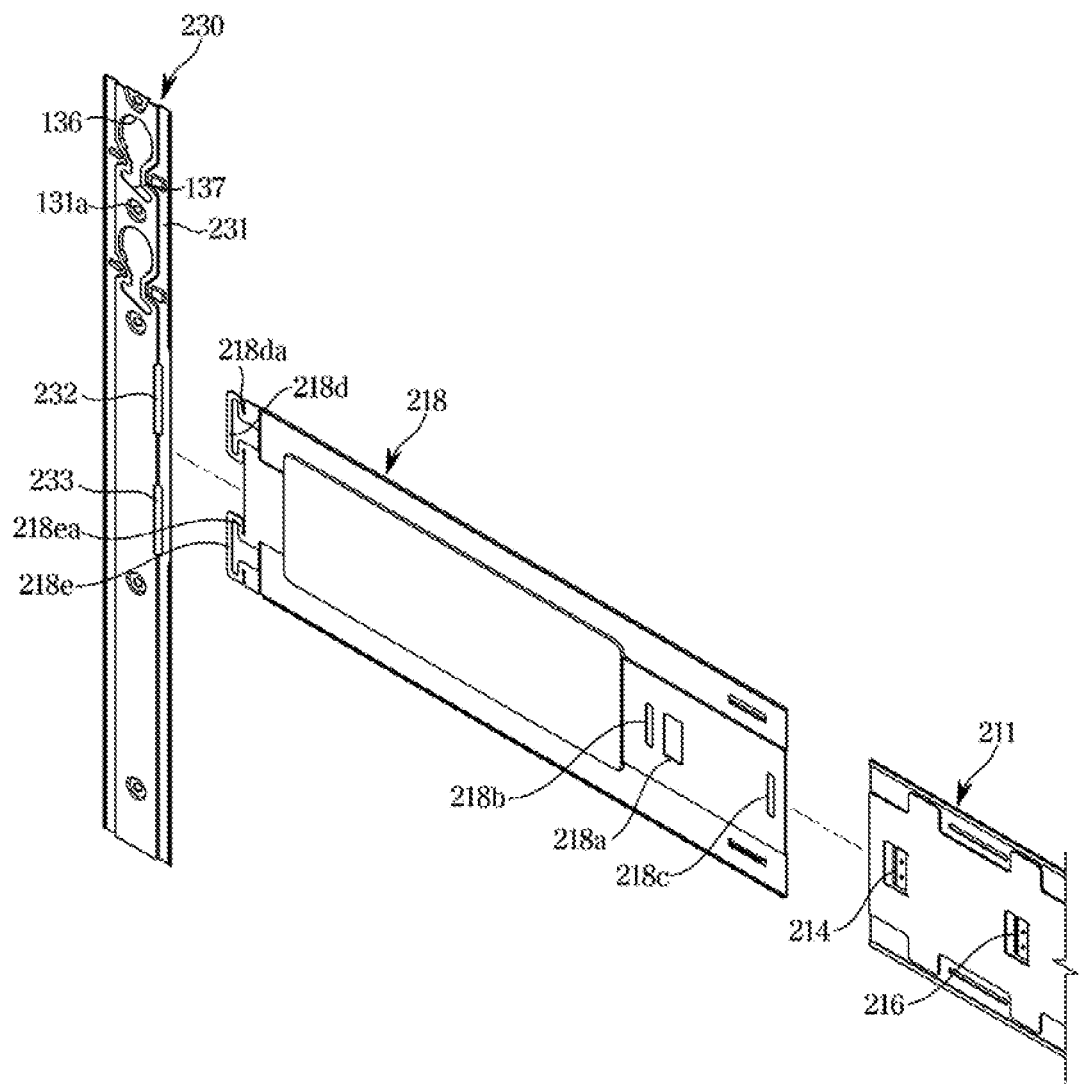
FIG. 11 is an exploded view of a first guide bracket, a second guide bracket, and a first fixing bracket of the wall mount shown in FIG. 10.

FIG. 10 is an exploded perspective view of a wall mount and a display of a display apparatus according to another embodiment of the disclosure. FIG. 11 is an exploded view of a first guide bracket, a second guide bracket, and a first fixing bracket of the wall mount shown in FIG. 10.

Referring to FIGS. 10 and 11, a display apparatus 2 according to another embodiment of the disclosure will be described. In the following description about the display apparatus 2 according to another embodiment of the disclosure, like components may be assigned like reference numerals, and detailed descriptions thereof will be omitted.

Referring to FIG. 10, the display apparatus 2 according to another embodiment of the disclosure may include a display 30 and a wall mount 200.

The display 30 may include a holder 13 and a magnet 34 to be mounted on the wall mount 200. Unlike FIG. 2, the magnet 34 may be positioned in locations corresponding to a guide member 210 and fixing brackets 220 and 230 of the wall mount 200. The guide member 210 and the fixing brackets 220 and 230 shown in FIG. 10 may be magnetic bodies to fix the magnet 34 of the display 30. The guide member 210 and the fixing brackets 220 and 230 may be made of steel plates.

The wall mount 200 may include the guide member 210 and the fixing brackets 220 and 230.

The guide member 210 may include a guide bracket 211, a first extension bracket 217 and a second extension bracket 218.

The guide bracket 211 may be coupled to the wall 200 through an installation hole 212. When a coupling member (not shown) penetrates the installation hole 212 to be fixed to the wall 20, the guide bracket 211 may be fixed to the wall 20. The guide bracket 211 may include a first guide coupling portion 213, a second guide coupling portion 214, a third guide coupling portion 215, and a fourth guide coupling portion 216.

Referring to FIG. 11, the first guide coupling portion 213 may be positioned in one end portion of the guide bracket 211 at which the guide bracket 211 is coupled to the first extension bracket 217. The first guide coupling portion 213 may be coupled to 1a-th extension coupling portions 217a and 217b (see FIG. 14) or a 1b-th extension coupling portion (not shown). The 1a-th extension coupling portions 217a and 217b may be symmetrical to 2a-th extension coupling portions 218a and 218b. The 1b-th extension coupling portion (not shown) may be symmetrical to a 2b-th extension coupling portion 218c. The first guide coupling portion 213 may be hooked to the 1a-th extension coupling portions 217a and 217b or the 1b-th extension coupling portion (not shown).

The second guide coupling portion 214 may be positioned in the other end portion of the guide bracket 211 coupled to the second extension bracket 218, and may be symmetrical to the first guide coupling portion 213. The second guide coupling portion 214 may be coupled to the 2a-th extension coupling portions 218a and 218b or the 2b-th extension coupling portion 218c. The second guide coupling portion 214 may be hooked to the 2a-th extension coupling portions 218a and 218b or the 2b-th extension coupling portion 218c.

The third guide coupling portion 215 may be positioned between a center of the guide bracket 211 and the first extension bracket 217. The third guide coupling portion 215 may be coupled to the 1b-th extension coupling portion. The third guide coupling portion 215 may be hooked to the 1b-th extension coupling portion.

The fourth guide coupling portion 216 may be positioned between the center of the guide bracket 211 and the second extension bracket 218, and may be symmetrical to the third guide coupling portion 215. The fourth guide coupling portion 216 may be coupled to the 2b-th extension coupling portion 218c. The fourth guide coupling portion 216 may be hooked to the 2b-th extension coupling portion 218c.

One end portion of the first extension bracket 217 may be able to be coupled to the first guide coupling portion 213 or the third guide coupling portion 215, and the other end portion of the first extension bracket 217, which is opposite to the one end portion of the first extension bracket 217, may be able to be coupled to the first fixing bracket 220.

The first extension bracket 217 may include the 1b-th extension coupling portion formed at one end portion coupled to the guide bracket 211, and the 1a-th extension coupling portions 217a and 217b positioned between the 1b-th extension coupling portion and a center of the first extension bracket 217. The 1a-th extension coupling portions 217a and 217b may be symmetrical to the 2a-th extension coupling portions 218a and 218b, and the 1b-th extension coupling portion may be symmetrical to the 2b-th extension coupling portion 218c.

The first extension bracket 217 may include a first extension support (not shown) that is coupled to the first fixing bracket 220. The first extension support may be symmetrical to second extension supports 218d and 218e which will be described later. Therefore, a detailed description about the first extension support will be omitted, and the second extension supports 218d and 218e will be described in detail, later.

One end portion of the second extension bracket 218 may be able to be coupled to the second guide coupling portion 214 or the fourth guide coupling portion 216, and the other end portion of the second extension bracket 218, which is opposite to the one end portion of the second extension bracket 218, may be able to be coupled to the second fixing bracket 230.

The second extension bracket 218 may include the 2b-th extension coupling portion 218c formed at one end portion coupled to the guide bracket 211, and the 2a-th extension coupling portions 218a and 218b positioned between the 2b-th extension coupling portion 218c and the center of the second extension bracket 218. The 2a-th extension coupling portions 218a and 218b may be symmetrical to the 1a-th extension coupling portions 217a and 217b, and the 2b-th extension coupling portion 218c may be symmetrical to the 1b-th extension coupling portion.

The second extension bracket 218 may include the second extension supports 218d and 218e that are coupled to the second fixing bracket 230. The second extension supports 218d and 218e may include a 2a-th extension support 218d and a 2b-th extension support 218e.

The 2a-th extension support 218d may include a 2a-th extension support groove 218da. The 2a-th extension support 218d may be inserted in a 2a-th inserting portion 232 of the second fixing bracket 230. After the 2a-th extension support 218d is inserted in the 2a-th inserting portion 232, the second fixing bracket 230 may fall so that one portion of the second fixing bracket 230 may be inserted in the 2a-th extension support groove 218da and fixed.

The 2b-th extension support 218e may include a 2b-th extension support groove 218ea. The 2b-th extension support 218e may be positioned below the 2a-th extension support 218d. The 2b-th extension support 218e may be inserted in a 2b-th inserting portion 233 of the second fixing bracket 230. After the 2b-th extension support 218e is inserted in the 2b-th inserting portion 233, the second fixing bracket 230 may fall so that one portion of the second fixing bracket 230 may be inserted in the 2b-th extension support groove 218ea and fixed.

The first fixing bracket 220 may be symmetrical to the second fixing bracket 230, and therefore, a detailed description thereof will be omitted.

The second fixing bracket 230 may include a second bracket body 231. In the second bracket body 231, a 2a-th inserting portion 232 which the 2a-th extension support 218d of the second extension bracket 218 is inserted in and coupled to, and a 2b-th inserting portion 233 which the 2b-th extension support 218e is inserted in and coupled to may be formed.

Figure 12:
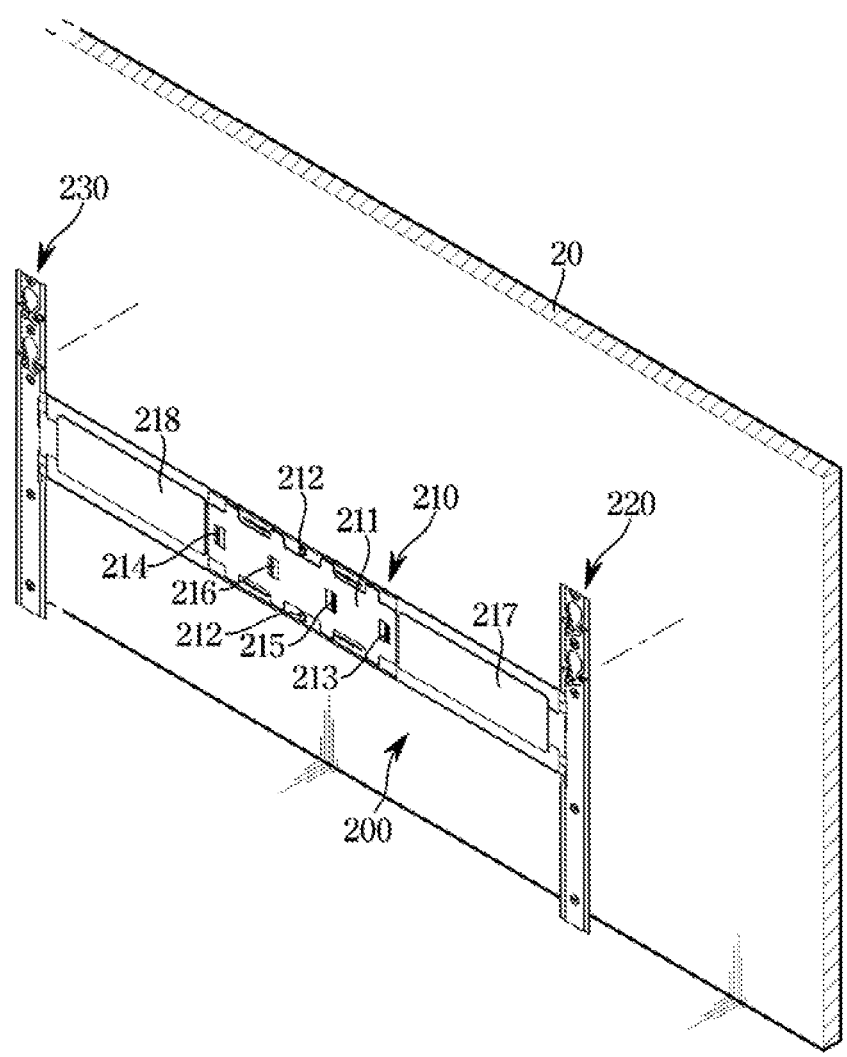
FIG. 12 is a view for describing an operation of mounting a wall mount on a wall shown in FIG. 10.
Figure 13:
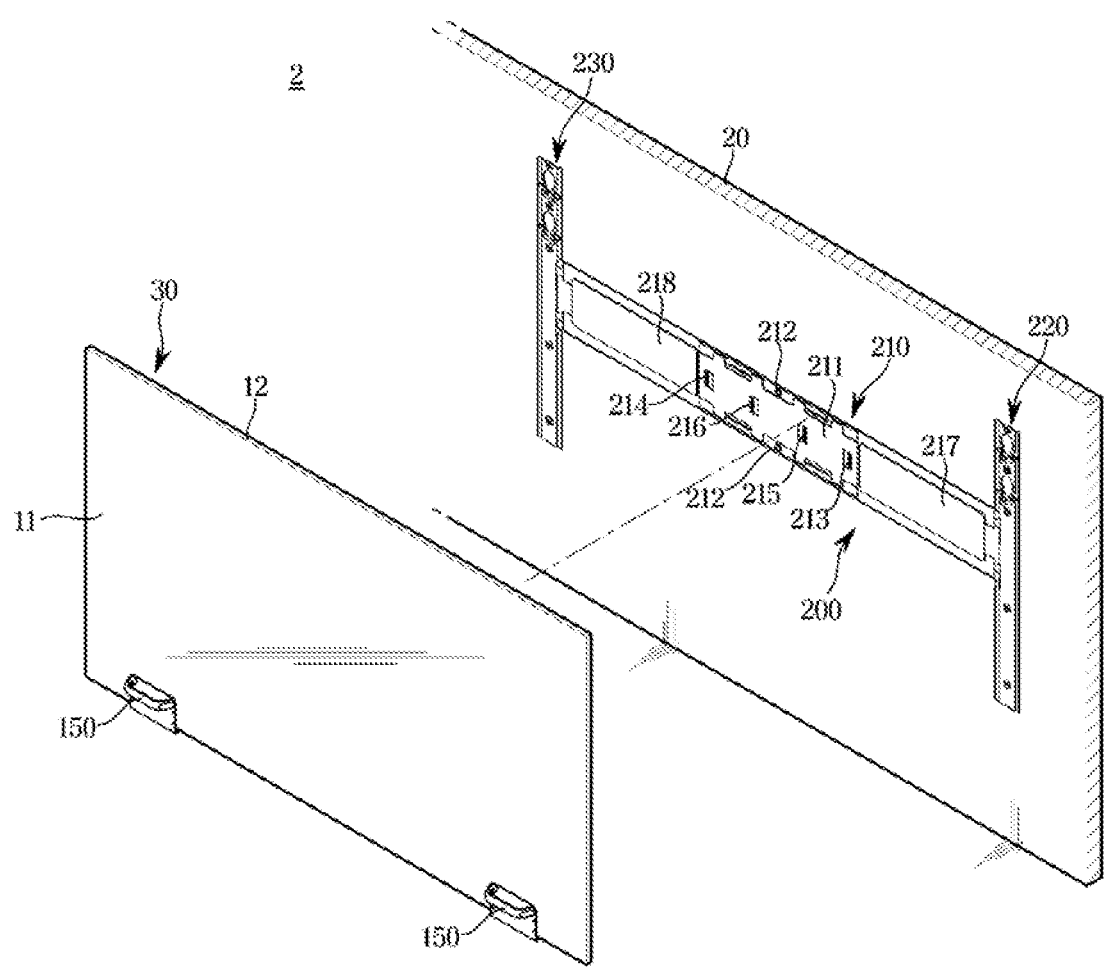
FIG. 13 is a view for describing an operation of mounting a display on the wall mount after the wall mount shown in FIG. 12 is mounted on the wall.

FIG. 12 is a view for describing an operation of mounting a wall mount on a wall shown in FIG. 10. FIG. 13 is a view for describing an operation of mounting a display on the wall mount after the wall mount shown in FIG. 12 is mounted on the wall.

Referring to FIGS. 12 and 13, a process of installing the display apparatus 2 according to another embodiment of the disclosure will be described.

Referring to FIG. 12, unlike the wall mount 100 shown in FIG. 5, the wall mount 200 according to another embodiment of the disclosure may be fixed to the wall 20 in the state in which the fixing brackets 220 and 230 are coupled to the guide member 210. The reason is because the guide member 110 shown in FIG. 5 is made of a flexible material and the guide member 210 shown in FIG. 12 includes a material with predetermined stiffness like the fixing brackets 220 and 230.

Referring to FIG. 13, an installer may move the display 30 to the wall mount 200 while supporting the display 30 through the handle 150. By using the handle 150, the installer may stably and easily mount the display 30 on the wall mount 200.

Figure 14:
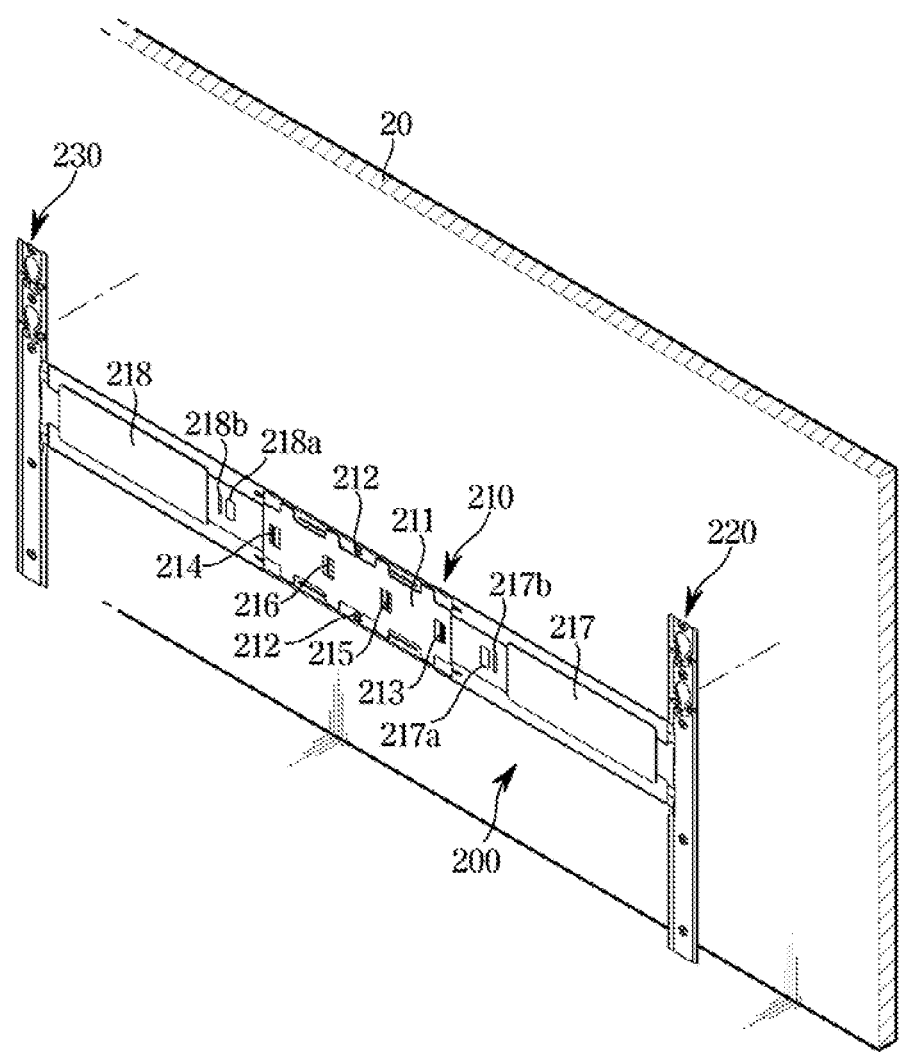
FIG. 14 shows a state in which the wall mount shown in FIG. 11 supports a display of a size that is different from that of the display shown in FIG. 13.

FIG. 14 shows a state in which the wall mount shown in FIG. 11 supports a display of a size that is different from that of the display shown in FIG. 13.

Referring to FIG. 14, when a display with a larger size than the display 30 shown in FIG. 13 is mounted on the wall 20, the first extension bracket 217 and the second extension bracket 218 of the wall mount 200 may be coupled to other portions of the guide bracket 211, which are different from the portions of the guide bracket 211 at which the first extension bracket 217 and the second extension bracket 218 are coupled to the guide bracket 211 shown in FIG. 13.

More specifically, referring to FIG. 14, the 1b-th extension coupling portion of the first extension bracket 217 may be coupled to the first guide coupling portion 213, and the 2b-th extension coupling portion 218c of the second extension bracket 218 may be coupled to the second guide coupling portion 214. Accordingly, the third guide coupling portion 215 may be not coupled to the first extension bracket 217, and the fourth guide coupling portion 216 may be not coupled to the second extension bracket 218.

As such, in the wall mount 200 of the display apparatus 2 according to another embodiment of the disclosure, because the guide bracket 211 is able to be coupled to the extension brackets 217 and 218 at various positions, the guide member 210 may adjust a space between the first fixing bracket 220 and the second fixing bracket 230, and accordingly, the wall mount 200 may support displays 30 of various sizes. Accordingly, the wall mount 200 of the display apparatus 2 according to another embodiment of the disclosure may be effective in view of inventory management and reduce product cost.

Figure 15:
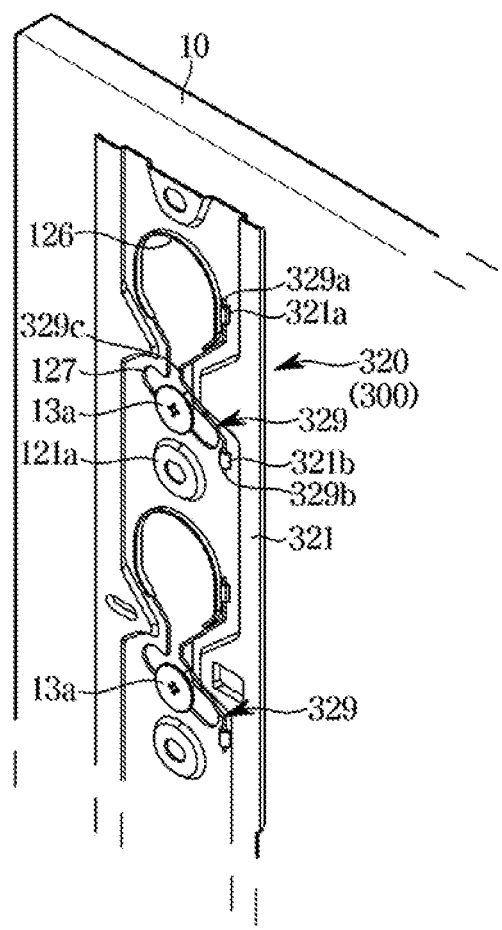
FIG. 15 shows a state in which a display is mounted on a first fixing bracket of a wall mount according to still another embodiment of the disclosure.

FIG. 15 shows a state in which a display is mounted on a first fixing bracket of a wall mount according to still another embodiment of the disclosure.

Referring to FIG. 15, a wall mount 300 according to still another embodiment of the disclosure will be described. However, in the following description about the wall mount 300 according to still another embodiment of the disclosure, like components will be assigned like reference numerals, and detailed descriptions thereof will be omitted. Also, for convenience of description, a first fixing bracket 320 of the wall mount 300 will be described and a description about a second fixing bracket (not shown) will be omitted. A configuration of the first fixing bracket 320 may be applied as it is to the second fixing bracket.

Referring to FIG. 15, the first fixing bracket 320 of the wall mount 300 according to still another embodiment of the disclosure may include a first bracket body 321, and a separation preventing member 329 fixed to the first bracket body 321.

One end 329a of the separation preventing member 329 may be inserted in a 1a-th fixing hole 321a provided in the first bracket body 321 and fixed, and the other end 329b of the separation preventing member 329 may be inserted in a 1b-th fixing hole 321b provided in the first bracket body 321 and fixed. The separation preventing member 329 may be slidingly coupled to the 1a-th fixing hole 321a and the 1b-th fixing hole 321b.

The separation preventing member 329 may include an interfering portion 329c protruding inward at a connection area between the first through opening 126 and the first adjusting slit 127. The interfering portion 329c of the separation preventing member 329 may extend from the one end 329a and the other end 329b. The interfering portion 329c of the separation preventing member 329 may be positioned between the one end 329a and the other end 329b. The interfering portion 329c may interfere in a movement of the first holder 13a when the first holder 13a moves between the first through opening 126 and the first adjusting slit 127.

More specifically, the interfering portion 329c may be positioned on a path along which the first holder 13a moves between the first through opening 126 and the first adjusting slit 127. The separation preventing member 329 may include a material with elasticity. Accordingly, when a force of a predetermined strength or more is applied to the first holder 13a, the first holder 13a may deform the separation preventing member 329 to move between the first through opening 126 and the first adjusting slit 127. That is, when a force of a predetermined strength or more is not applied to the first holder 13a, the separation preventing member 329 may limit a movement of the first holder 13a such that the first holder 13a is unable to move from the first adjusting slit 127 to the first through opening 126.

According to the configuration, the first fixing bracket 320 of the wall mount 300 according to still another embodiment of the disclosure may stably support the display 10 when the display 10 is mounted on the wall mount 300.

According to a concept of the disclosure, because the wall mount is configured such that the fixing brackets are able to be coupled to various positions of the guide member, the wall mount may support displays of various sizes.

According to a concept of the disclosure, because the wall mount is able to support displays of various sizes, the wall mount may be effective in view of inventory management.

According to a concept of the disclosure, because a separate groove for coupling does not need to be formed in the rear surface of the display, the design of the display may be improved.

According to a concept of the disclosure, because the adjusting slits are formed in the fixing brackets, it may be possible to easily adjust the horizontal level of the display.

According to a concept of the disclosure, because the display is fixed to the wall mount through the holder and the magnet, it may be possible to firmly fix the display to a wall such that the display is in close contact with the wall.

According to a concept of the disclosure, because the display apparatus includes the handle for stably supporting the display when the display is mounted on the wall mount, it may be possible to easily mount the display on the wall mount.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. A wall mount comprising:
   a first bracket mountable on a wall and coupleable to an apparatus to be mounted on the wall;
   a second bracket mountable on the wall and coupleable to the apparatus to be mounted on the wall; and
   a guide member including first, second, third and fourth guide coupling portions aligned with each other along the guide member with the third and fourth guide coupling portions between the first and second guide coupling portions, the third guide coupling portion between the first guide coupling portion and a center of the guide member, and the fourth guide coupling portion between the second guide coupling portion and the center of the guide member,
   wherein the first bracket is coupleable to either the first guide coupling portion or the third guide coupling portion and the second bracket is coupleable to either the second guide coupling portion or the fourth guide coupling portion, so that a distance between the first bracket and the second bracket is adjustable, and mounting positions of the first bracket and the second bracket on the wall are guidable, by the guide member when the first bracket and the second bracket are being mounted on the wall,
   the wall mount thereby being configured to, when the first bracket and the second bracket are mounted at the mounting positions on the wall and coupled to the apparatus, mount the apparatus on the wall,
   wherein the guide member is made of a material that is different from a material of the first bracket and a material of the second bracket.

2. The wall mount according to claim 1, further comprising:
   a magnetic body configured to be mounted on the wall so that, when the magnetic body is mounted on the wall with the first bracket and the second bracket mounted on the wall and coupled to the apparatus, the magnetic body is positioned to correspond to a magnet on the apparatus.

3. The wall mount according to claim 1, wherein
   the first bracket includes a first adjusting slit inclined with respect to a direction of gravity and which is coupleable with a first holder of the apparatus to couple the first bracket to the apparatus, and
   the second bracket comprises a second adjusting slit being symmetrical to the first adjusting slit with respect to the center of the guide member and which is coupleable with a second holder of the apparatus to couple the second bracket to the apparatus.

4. The wall mount according to claim 1, wherein the first bracket comprises:
   a first catching portion configured so that, when the first bracket is coupled to either the first guide coupling portion or the third guide coupling portion, the first catching portion is supported in a direction of gravity by the first guide coupling portion or the third guide coupling portion to which the first bracket is coupled; and a first limiting portion configured so that, when the first bracket is coupled to either the first guide coupling portion or the third guide coupling portion, the first limiting portion limits horizontal movement of the first guide coupling portion or the third guide coupling portion to which the first bracket is coupled.

5. The wall mount according to claim 1, wherein the second bracket comprises:

a second catching portion configured so that, when the second bracket is coupled to either the second guide coupling portion or the fourth guide coupling portion, the second catching portion is supported in a direction of gravity by the second guide coupling portion or the fourth guide coupling portion to which the second bracket is coupled; and a second limiting portion configured so that, when the second bracket is coupled to either the second guide coupling portion or the fourth guide coupling portion, the second limiting portion limits horizontal movement of the second guide coupling portion or the fourth guide coupling portion to which the second bracket is coupled.

6. The wall mount according to claim 1, wherein the guide member has a first end and a second end, with the first guide coupling portion being closer to the first end than the second guide coupling portion, and the second guide coupling portion being closer to the second end than the first guide coupling portion, the first bracket includes a first inserting portion in which the first end is insertable to allow the first bracket to be coupled to either the first guide coupling portion or the third guide coupling portion, and the second bracket includes a second inserting portion in which the second end is insertable to allow the second bracket to be coupled to either the second guide coupling portion or the fourth guide coupling.

7. The wall mount according to claim 1, wherein the guide member includes an installation hole formed in the center, the first bracket includes a first hole into which a first coupling member is insertable to mount the first bracket on the wall, and the second bracket includes a second hole into which a second coupling member is insertable to mount the second bracket on the wall.

8. A display apparatus comprising:

a display; and a wall mount including:

a first bracket mountable on a wall and coupleable to the display, a second bracket mountable on the wall and coupleable to the display, and a guide member coupleable to the first bracket and the second bracket so that, when the guide member is coupled to the first bracket and the second bracket, the guide member separates the first bracket and the second bracket by a distance, wherein the guide member is configured to adjust the distance so that, when the first bracket and the second bracket are being mounted on the wall, mounting positions of the first bracket and the second bracket on the wall are adjustable, the wall mount thereby being configured to, when the first bracket and the second bracket are mounted on the wall at the mounting positions and coupled to the display, mount the display on the wall, wherein the guide member is made of a material that is different from a material of the first bracket and a material of the second bracket.

9. The display apparatus according to claim 8, wherein the display includes:

a first holder coupleable to the first bracket to couple the first bracket to the display, and a second holder coupleable to the second bracket to couple the second bracket to the display.

10. The display apparatus according to claim 9, wherein the first holder and the second holder are positioned in higher locations than a center in an up-down direction of a rear surface of the display.

11. The display apparatus according to claim 9, wherein the first bracket includes a separation preventing member configured to prevent the first holder from escaping from the first bracket when the display is mounted on the wall by the wall mount, the separation preventing member including a material with elasticity.

12. The display apparatus according to claim 8, further comprising:

a handle to support the display when the display is being coupled to the first bracket and the second bracket.

13. The display apparatus according to claim 8, wherein the guide member includes:

first, second, third and fourth guide coupling portions aligned with each other along the guide member with the third and fourth guide coupling portions between the first and second guide coupling portions, the third guide coupling portion between the first guide coupling portion and a center of the guide member, and the fourth guide coupling portion between the second guide coupling portion and the center of the guide member.

14. The display apparatus according to claim 13, wherein the first bracket is coupleable to the first guide coupling portion or the third guide coupling portion to couple the guide member to the first bracket, and the second bracket is coupleable to the second guide coupling portion or the fourth guide coupling portion to couple the guide member to the second bracket.

15. The display apparatus according to claim 8, wherein the material of which the guide member is made is lighter than the material of the first bracket and the material of the second bracket.

16. The display apparatus according to claim 8, wherein the display includes a magnet, and the wall mount includes a magnetic body configured to be mounted on the wall so that, when the magnet body is mounted on the wall with the first bracket and the second bracket mounted on the wall and coupled to the display, the magnetic body is positioned to correspond to the magnet of the display.

17. The display apparatus according to claim 8, wherein the guide member comprises:

a guide bracket including first, second, third and fourth guide coupling portions aligned with each other along the guide member with the third and fourth guide coupling portions between the first and second guide coupling portions, the third guide coupling portion between the first guide coupling portion and a center of the guide bracket, and the fourth guide coupling portion between the second guide coupling portion and the center of the guide bracket, a first extension bracket having a first end portion coupleable to either the first guide coupling portion or the third guide coupling portion, and a second end portion coupleable to the first bracket, and a second extension bracket having a first end portion coupleable to either the second guide coupling portion or the fourth guide coupling portion, and a second end portion coupleable to the second fixing bracket.

18. The display apparatus according to claim 17, wherein the display includes a magnet positioned to correspond to the guide member, and
the guide member is a magnetic body.

19. A wall mount comprising:
a first bracket mountable on a wall and coupleable to a display;
a second bracket mountable on the wall and coupleable to the display; and a guide member coupleable to the first bracket and the second bracket so that, when the guide member is coupled to the first bracket and the second bracket, the guide member separates the first bracket and the second bracket by a distance, wherein the guide member is configured to adjust the distance so that, when the first bracket and the second bracket are being mounted on the wall, mounting positions of the first bracket and the second bracket on the wall are adjustable, the wall mount thereby being configured to, when the first bracket and the second bracket are mounted on the wall at the mounting position and coupled to the display, mount the display on the wall, wherein the guide member is made of a material that is different from a material of the first bracket and a material of the second bracket.

* * * * *